(12) United States Patent
Kimura et al.

(10) Patent No.: US 9,685,399 B2
(45) Date of Patent: Jun. 20, 2017

(54) POWER SEMICONDUCTOR DEVICE

(71) Applicant: Mitsubishi Electric Corporation, Tokyo (JP)

(72) Inventors: Toru Kimura, Tokyo (JP); Yoichi Goto, Tokyo (JP); Kiyofumi Kitai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/037,388

(22) PCT Filed: Dec. 5, 2013

(86) PCT No.: PCT/JP2013/007153
§ 371 (c)(1),
(2) Date: May 18, 2016

(87) PCT Pub. No.: WO2015/083201
PCT Pub. Date: Jun. 11, 2015

(65) Prior Publication Data
US 2016/0300785 A1 Oct. 13, 2016

(51) Int. Cl.
*H01L 23/49* (2006.01)
*H01L 23/29* (2006.01)
(Continued)

(52) U.S. Cl.
CPC ........ *H01L 23/49568* (2013.01); *H01L 23/29* (2013.01); *H01L 23/3121* (2013.01);
(Continued)

(58) Field of Classification Search
CPC ............... H01L 23/49568; H01L 23/29; H01L 23/3121; H01L 23/3672; H01L 23/3677; H01L 23/4334; H01L 23/4924; H01L 23/49541; H01L 24/32; H01L 25/00; H01L 25/0655
See application file for complete search history.

(56) References Cited

U.S. PATENT DOCUMENTS

| 6,642,576 | B1 * | 11/2003 | Shirasawa | ............. H01L 25/071 257/288 |
| 6,711,904 | B1 * | 3/2004 | Law | ........................ F25B 21/02 257/E23.08 |
| 6,712,621 | B2 * | 3/2004 | Li | ......................... H01L 23/367 257/E23.102 |

(Continued)

FOREIGN PATENT DOCUMENTS

| JP | 2012-28402 A | 2/2012 |
| JP | 2012-49167 A | 3/2012 |
| WO | 2014/020704 A1 | 2/2014 |

OTHER PUBLICATIONS

International Search Report for PCT/JP2013/007153 dated Mar. 4, 2014.

*Primary Examiner* — Ida M Soward
(74) *Attorney, Agent, or Firm* — Sughrue Mion, PLLC; Richard C. Turner

(57) ABSTRACT

A power semiconductor device is provided with a base plate thermally connected to the power semiconductor element for heat generated from the power semiconductor element to be conducted to heat radiation fins. An electrically conductive member fixed to the base plate is electrically conducted to the base plate and is connected to ground, and has projections fitted into notches provided in the electrically conductive member. By deforming the projections, the electrically conductive member is fixed to the base plate and electrical conduction can be secured. With this arrangement, noise radiated from the power semiconductor element is reduced and malfunction of the power semiconductor element is suppressed.

12 Claims, 8 Drawing Sheets

(51) Int. Cl.
  *H01L 23/31* (2006.01)
  *H01L 23/36* (2006.01)
  *H01L 25/00* (2006.01)
  *H01L 23/495* (2006.01)
  *H01L 23/367* (2006.01)
  *H01L 23/433* (2006.01)
  *H01L 23/492* (2006.01)
  *H01L 23/00* (2006.01)
  *H01L 25/065* (2006.01)
  *H01L 23/373* (2006.01)

(52) U.S. Cl.
  CPC ...... *H01L 23/3672* (2013.01); *H01L 23/3677* (2013.01); *H01L 23/4334* (2013.01); *H01L 23/4924* (2013.01); *H01L 23/49541* (2013.01); *H01L 24/32* (2013.01); *H01L 25/00* (2013.01); *H01L 25/0655* (2013.01); *H01L 23/3735* (2013.01); *H01L 23/49565* (2013.01); *H01L 2224/32245* (2013.01); *H01L 2924/0002* (2013.01); *H01L 2924/01013* (2013.01)

(56) References Cited

U.S. PATENT DOCUMENTS

| | | | |
|---|---|---|---|
| 7,149,088 B2 * | 12/2006 | Lin | H05K 7/209 257/707 |
| 7,786,565 B2 * | 8/2010 | Kitabatake | H01L 23/3672 257/689 |
| 8,643,171 B1 * | 2/2014 | Nakazato | H01L 23/34 165/80.3 |
| 8,952,525 B2 * | 2/2015 | Ide | H01L 23/36 257/706 |
| 8,963,321 B2 * | 2/2015 | Lenniger | H01L 23/367 257/691 |
| 9,134,076 B2 * | 9/2015 | Yoshihara | F28F 3/02 |
| 9,472,488 B2 * | 10/2016 | Gohara | H01L 23/473 |
| 9,521,737 B2 * | 12/2016 | Izuo | H01L 23/13 |
| 2002/0070005 A1 * | 6/2002 | Kawabata | B21D 53/02 165/80.3 |
| 2005/0280998 A1 * | 12/2005 | Lin | H05K 7/209 361/704 |
| 2010/0238629 A1 * | 9/2010 | Shiba | H01L 23/473 361/699 |
| 2011/0031612 A1 * | 2/2011 | Mitsui | H01L 23/3107 257/713 |
| 2011/0216507 A1 * | 9/2011 | Kadomoto | H05K 7/20 361/714 |
| 2011/0304039 A1 * | 12/2011 | Miyamoto | H01L 23/4006 257/712 |
| 2014/0035122 A1 | 2/2014 | Nakazato et al. | |
| 2014/0355218 A1 * | 12/2014 | Vinciarelli | H01R 43/205 361/728 |

* cited by examiner

POWER SEMICONDUCTOR DEVICE

CROSS REFERENCE TO RELATED APPLICATIONS

This application is a National Stage of International Application No. PCT/JP2013/007153 filed Dec. 5, 2013, the contents of which are incorporated herein by reference in their entirety.

TECHNICAL FIELD

The present invention relates to a power semiconductor device.

BACKGROUND ART

Conventionally, when a heat sink is attached for cooling an electronic component (power semiconductor element) such as a CPU (central processing unit) or a power transistor which intensely generates heat, application of thermal grease has been widely performed in order to enhance thermal conductivity by filling the thermal grease into a small gap in the joining portion between the electric component and the heat sink. Since the thermal conductivity of the thermal grease is much lower than that of metal, a radiation-fin-integrated semiconductor device in which heat radiation fins and a metallic base plate of a power semiconductor element are integrated has been also realized in order to obtain higher heat radiation performance without using the thermal grease. In the radiation-fin-integrated power semiconductor device, grooves for joining the heat radiation fins into the base plate are provided and resin-molding is performed in a state such that a part of the base plate surface including a portion where the grooves are formed is exposed. The heat radiation fins are inserted into the grooves of the base plate and then swaged to fix them, thereby integrating the base plate and the heat radiation fins to improve the heat radiation performance.

In the power semiconductor device in which the heat radiation performance is improved by the method described above, it is known that noise radiated from the power semiconductor element or malfunction is suppressed by stacking a metal member onto the base plate and by giving the metal member a function to connect the power semiconductor device to the earth potential (refer to Patent Document 1).

PRIOR ART DOCUMENT

Patent Document

Patent Document 1: Japanese Patent Laid-Open Publication No. 2012-49167

SUMMARY OF THE INVENTION

Problems to be Solved by the Invention

On the surfaces of the metal member and the base plate, oxide films are formed in the atmosphere. Electrical resistance of the oxide film is larger than that of metal itself. In the above-described conventional technique, the metal member is inserted between the heat radiation fins and the base plate, thereby realizing electrical contact between the metal member and the base plate. Non-oxidized and newly formed surfaces are exposed by a damage of the oxide films on the surfaces of the metal member and the base plate caused by the contact with each other, but the exposed area is very small. Accordingly the electrical connection therebetween is basically made through the oxide films formed on each surface. Thus, a problem arises that, even in the case where the metal member and the base plate have no warpage and are in surface contact, a percentage of the area where the electrical conduction is made by the contact of the non-oxidized and newly formed surfaces each other is small, resulting in large electrical resistance between the metal member and the base plate.

The present invention has been made in consideration of the problem described above, and an object is to obtain a power semiconductor device that is highly effective in reducing noise radiated from a power semiconductor element and suppressing malfunction of a power semiconductor element.

Means to Solve the Problem

In order to solve the above-described problems and attain the object in the present invention, a power semiconductor device includes: a power semiconductor element; a base plate that is made of electrically conductive material and is thermally connected to the power semiconductor element so as for heat generated from the power semiconductor element to be conducted to a heat radiation fin; and an electrically conductive member that is fixed to the base plate, is electrically conducted to the base plate, and is connected to earth ground, wherein a projection provided in the base plate is fitted into a notch provided in the electrically conductive member, and by deforming the projection the electrically conductive member is fixed to the base plate and electrical conduction can be secured.

Effect of the Invention

In a power semiconductor device according to the present invention, by deforming projections of a base plate to fix the electrically conductive member to the base plate, oxide films between the base plate and the electrically conductive member are damaged, and thus the base plate comes into contact with the metal member in a state where newly formed surfaces each having small electrical resistance are exposed, enabling the electric resistance to be low. Therefore effects to reduce noise radiated from the power semiconductor element and to suppress malfunction of the power semiconductor element can be enhanced.

EMBODIMENTS FOR CARRYING OUT THE INVENTION

Hereinafter, embodiments for power semiconductor devices according to the present invention will be described in detail on the basis of figures. Note that the invention is not limited to the embodiments.

Embodiment 1

Figure 1:
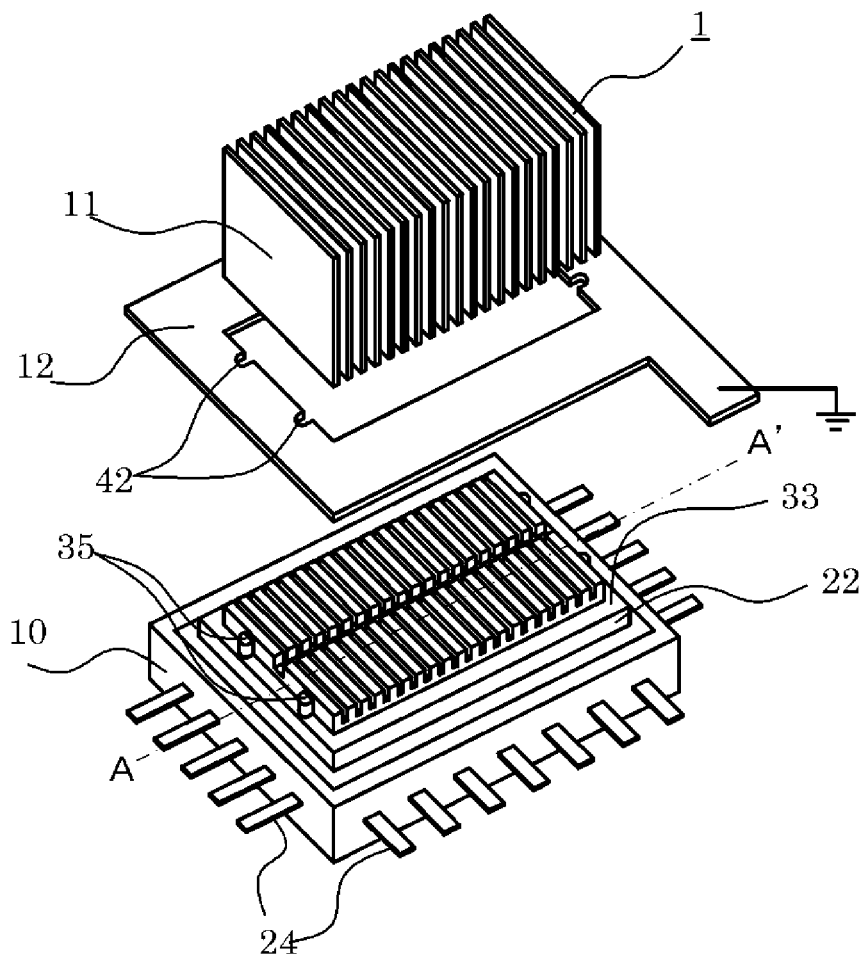
FIG. 1 is an exploded perspective view showing a configuration of a power semiconductor device according to Embodiment 1 of the present invention.
Figure 2:
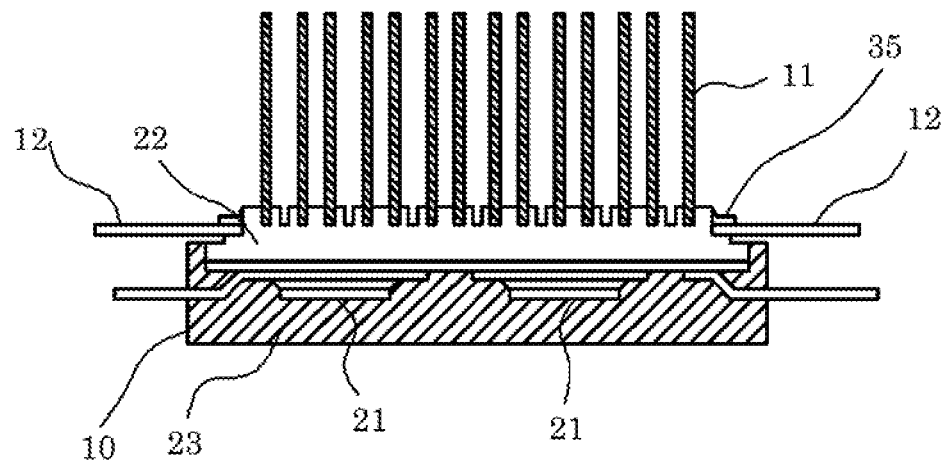
FIG. 2 is a cross sectional view of the power semiconductor device according to Embodiment 1 of the present invention.

FIG. 1 is an exploded perspective view showing a configuration of a power semiconductor device according to Embodiment 1 of the present invention. FIG. 2 is a cross sectional view of the power semiconductor device according to Embodiment 1 of the present invention. The power semiconductor device 1 according to Embodiment 1 includes a molded portion 10, heat radiation fins 11, and a metal member (electrically conductive member) 12.

Figure 3:
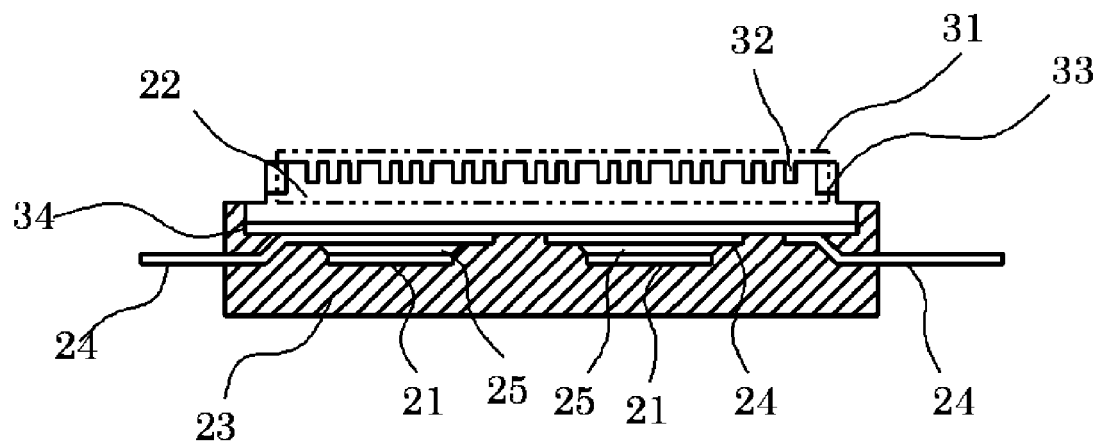
FIG. 3 is a cross sectional view of a molded portion in the power semiconductor device according to Embodiment 1 of the present invention.

FIG. 3 is a cross sectional view of the molded portion 10 before the heat radiation fins 11 and the metal member 12 are attached, in the power semiconductor device according to Embodiment 1 of the present invention. The molded portion 10 includes a power semiconductor element 21; a lead frame 24 mounting the power semiconductor element 21 on one surface thereof; a base plate 22 in which a highly thermally-conductive and electrically-insulating layer 34 is formed on one surface thereof and which is disposed on the side of the other surface of the lead frame 24; and a molding resin 23 which seals the power semiconductor element 21, and the lead frame 24 mounting the power semiconductor element 21 and the base plate 22 are integrated with the molding resin 23. The power semiconductor element 21 and the lead frame 24 are joined using solder 25. The highly thermally-conductive and electrically-insulating layer 34 is made from an epoxy resin and highly thermal conductive filler, and bonds the base plate 22 and the lead frame 24 together. In the base plate 22, a protruding portion 31 is formed on the side opposite to the side on which the highly thermally-conductive and electrically-insulating layer 34 is formed to protrude from the molding resin 23. In the protruding portion 31, a plurality of grooves 32 are provided. A flat surface 33 is provided at the periphery of the protruding portion 31. The base plate 22 is formed of metal (aluminum etc.) as its material which is softer and higher in the thermal conductivity than the metal member 12. By providing such a configuration, heat generated from the power semiconductor element 21 is efficiently conducted to the base plate 22, and also the power semiconductor element 21 can be electrically insulated from the base plate 22.

Figure 4:
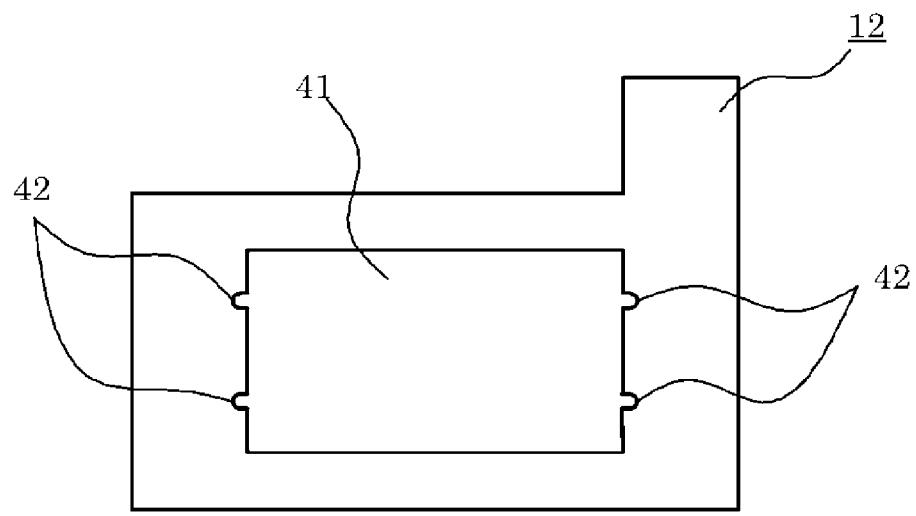
FIG. 4 is a top view of a metal member in the power semiconductor device according to Embodiment 1 of the present invention.

FIG. 4 is a top view of the metal member 12 in the power semiconductor device according to Embodiment 1 of the present invention. The metal member 12 has a plate-like structure from which a substantially rectangular portion is cut out as a cut-out portion 41 and the protruding portion 31 of the base plate 22 can be inserted into the cut-out portion 41. Here, the substantially rectangular portion means that it includes such a shape whose corners are rounded to prevent stress concentration at the corners. At the edges of two sides facing each other (here, both short sides) in the cut-out portion 41, notches 42 are provided. At the periphery of the protruding portion 31 of the base plate 22, projections 35 are provided at positions corresponding to the notches 42 for attaching the metal member 12 to the base plate 22. The projections 35 are formed together with the side surfaces of the protruding portion 31 and the flat surface 33 in the base plate 22.

The metal member 12 is formed of more rigid metal than the material of the base plate 22, and a steel plate, for example, can be used. Note that, considering the possibility of oxidization and corrosion of the metal member 12 depending on the environment where the power semiconductor device 1 is operated, it is preferable to use, as the material of the metal member 12, a galvanized steel plate or a stainless steel plate that is hardly oxidized and corroded. In particular, the galvanized steel plate is suitable for the material of the metal member 12 because of the lower cost than the stainless steel plate.

The heat radiation fins 11 have thin plate-like structure, and are prepared for the same number as the number of the plurality of grooves 32 that are in parallel and provided in the protruding portion 31 of the base plate 22, and the fins are inserted into the respective grooves 32 in the protruding portion 31 and sandwiched from right and left sides to be swaged, thereby being fixed to the base plate 22. Thus, heat generated from the power semiconductor 21 is thermally conducted to the base plate 22 and further conducted to the heat radiation fins 11 to be radiated, thereby enabling suppression of temperature rise in the power semiconductor element 21.

Figure 5:
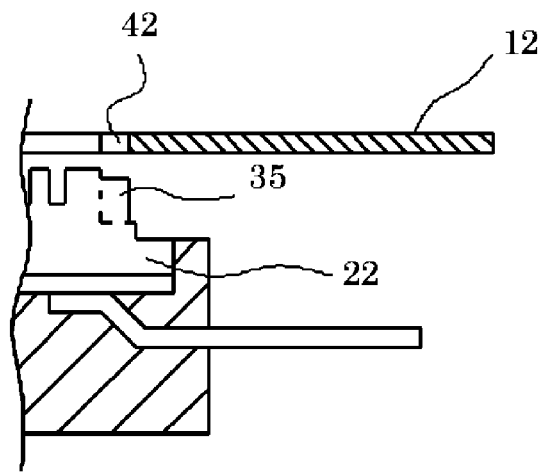
FIG. 5 is an enlarged cross sectional view of a contact portion of the metal member and a base plate before they come into contact.
Figure 6:
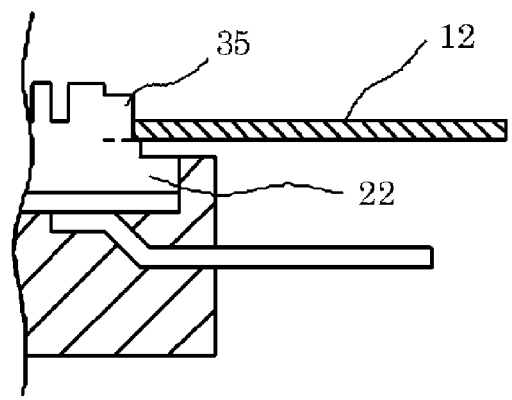
FIG. 6 is an enlarged cross sectional view of the contact portion of the metal member and the base plate after they come into contact.
Figure 7:
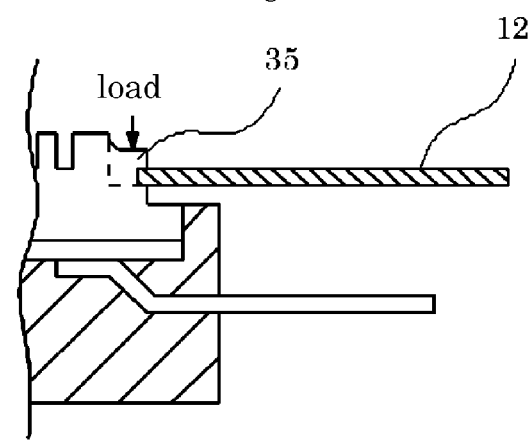
FIG. 7 is an enlarged cross sectional view of the contact portion of the metal member and the base plate after they come into contact.

FIGS. 5 to 7 are cross sectional views enlarged around the projection 35 in the cross section taken along the line A-A' in FIG. 1. FIG. 5 shows a state before the protruding portion 31 is inserted into the cut-out portion 41, FIG. 6 shows a state after the protruding portion 31 is inserted into the cut-out portion 41, and FIG. 7 shows a state in which the projection 35 has been deformed after insertion of the protruding portion 31 into the cut-out portion 41.

The protruding portion 31 of the base plate 22 is inserted into the cut-out portion 41, and thus the flat surface 33 of the base plate 22 comes into contact with the rear surface of the metal member 12, so that the metal member 12 is approximately positioned with respect to the base plate 22 while the projection 35 is inserted into the notch 42 of the metal member 12. Subsequently, a load is applied only to the projection 35, perpendicularly to the surface of the metal member 12 so as for the projection 35 to be plastically deformed by crushing. The projection 35 plastically flows by being plastically deformed as described above and spreads over the metal member 12 along its surface on the side of the projection 35 (on the surface opposite to the rear surface in contact with the flat surface 33). A portion of the projection is pushed to the inner side surface of the notch 42, and the remaining portion spreads further, running on the surface of the metal member 12 on the side of the projection 35 (on the surface opposite to the rear surface in contact with the flat surface 33), so that the metal member 12 is mechanically fixed to the base plate 22. Note that, since the metal member 12 is formed of more rigid metal than the base plate 22, the metal member 12 is less likely to be damaged even when the load is applied onto the projection 35.

In addition, the projection 35 comes into contact with the metal member 12 in a state in which the oxide film on the surface of the projection is damaged by the plastic flow and a newly formed surface whose electrical resistance is very small is exposed.

Further, the metal member 12 also comes into contact with the projection 35 in a state in which the oxide film on the surface of the metal member is damaged by pressure or friction when the projection 35 is plastically deformed and pushed to the metal member 12, and a newly formed surface whose electrical resistance is very small is exposed.

Accordingly, the portion where the deformed projection 35 and the metal member 12 are in contact with each other exhibits low electrical resistance because of the damaged oxide films, and thus the electrical resistance between the base plate 22 and the metal member 12 can be lowered. Furthermore, by setting electrical potential of the metal member 12 to the same potential as the earth potential, stable earth potential can be secured for the power semiconductor device, so that effects of reducing noise radiated from the power semiconductor element and suppressing malfunction of the power semiconductor element can be enhanced. Note that, in the metal member 12 except for the notches 42, the metal member 12 contributes to electrical conduction by the contact with the flat surface 33 of the base plate 22 even though the electrical conduction is through oxide films.

Note that, in the present embodiment, although the projection 35 is plastically deformed by applying the load, the method for the plastic deformation is not limited thereto. For example, the projection 35 may be plastically deformed by melting. Even in that case, an effect similar to the case where the load is applied can be obtained. The method of manufacturing the base plate 22 is as follows. The grooves 32 are formed by extrusion molding. After a base plate is cut out so that its short sides are parallel to the grooves 32, the projections and the flat surface 33 are formed by machining. That is, the projections 35 are formed after the grooves 32 are formed. Thus, in a case where the projections 35 are provided on the long sides of the base plate 22, it is impossible to set the width of the projections 35 to be more than the width of a partition between adjacent grooves 32. Therefore, in the present embodiment, considering the flexibility in the shape of the projections 35, the projections 35 are provided on the short sides which are parallel to the grooves 32 of the base plate. Needless to say, as long as no problem arises in setting the width of the projections 35 to be less than the width of a partition between adjacent grooves 32, the projections 35 may be provided on the long sides of the base plate. Although the number of projections 35 is assumed here to be two on each short side of the base plate 22, the number is not limited thereto. The projections 35 may be provided at a single position or at a plurality of positions not less than three on each side. The number of the projections 35 is preferably a minimum number required to fix the metal member 12 sufficiently rigidly to the base plate 22 and to sufficiently lower the electrical resistance between the base plate 22 and the metal member 12. Alternatively, even if the metal member 12 is formed in such a manner that it has no notches 42 and the cut-out portion is widened by the width of the projection 35, the metal member can be fixed after deforming the projections 35 and the electrical conduction can be secured, so that effects to reduce noise radiated from the power semiconductor element and to suppress malfunction of the power semiconductor element can be enhanced.

Embodiment 2

Figure 8:
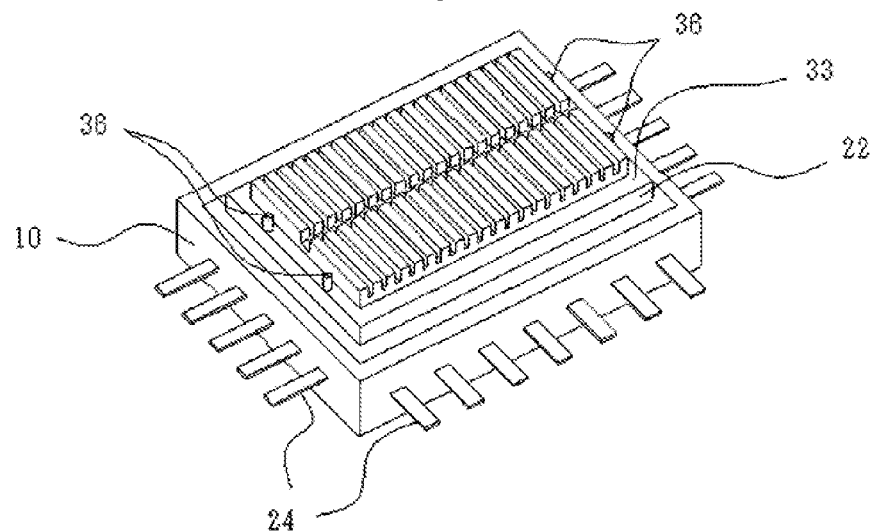
FIG. 8 is an exploded perspective view showing a configuration of a power semiconductor device according to Embodiment 2 of the present invention.

FIG. 8 is an exploded perspective view showing a configuration of a power semiconductor device according to Embodiment 2 of the present invention. The difference compared to Embodiment 1 is that the shape of the projection 35 is semi-cylindrical in Embodiment 1, but the shape thereof is cylindrical in Embodiment 2. In the case where a projection 36 is formed to be cylindrical in shape, the area integrated with the side of the protruding portion 31 in the base plate 22 is decreased, and thus a load required to plastically deform the projection 36 can be reduced.

The reason for the change in the shape of the projection 35 will be described below. The load required to plastically deform the projection 35 after the insertion of the protruding portion 31 into the cut-out portion 41 increases as the cross sectional area of the projection 35 or the area integrated with a side wall of the protruding portion 31 in the base plate 22 increases, and further increases as the number of projections 35 is increased. However it is concerned that an excessive load applied to the power semiconductor device during plastic deformation of the projection 35 causes a failure in the power semiconductor device. Accordingly, devising the shape and/or the number of projections so as for the load required to plastically deform the projection 35 to be as small as possible is important for preventing the power semiconductor device from failing and for stabilizing the quality of the power semiconductor device.

In order to suppress the load required to plastically deform the projection 36, the number of projections 36 is preferably a minimum number required to fix the metal member 12 sufficiently rigidly to the base plate 22 and to sufficiently lower the electrical resistance between the base plate 22 and the metal member 12.

Figure 9:
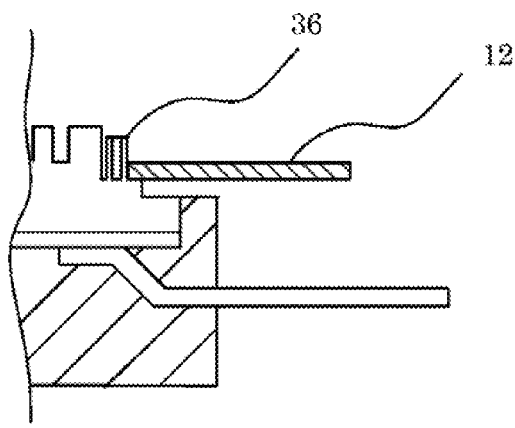
FIG. 9 is an enlarged cross sectional view around a hollow cylindrical projection in a state in which a metal member is inserted into a base plate but the projection is not deformed yet, according to Embodiment 2 of the present invention.
Figure 10:
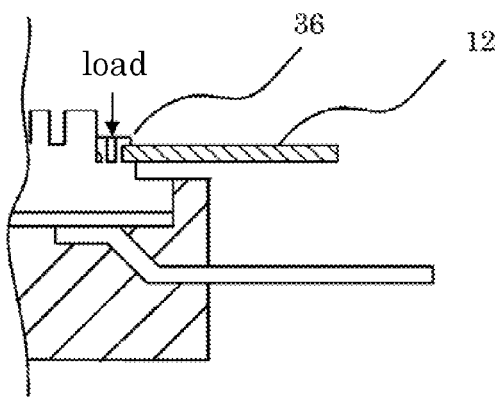
FIG. 10 is an enlarged cross sectional view around the hollow cylindrical projection after the metal member is inserted into the base plate and the projection is deformed according to Embodiment 2 of the present invention.
Figure 11:
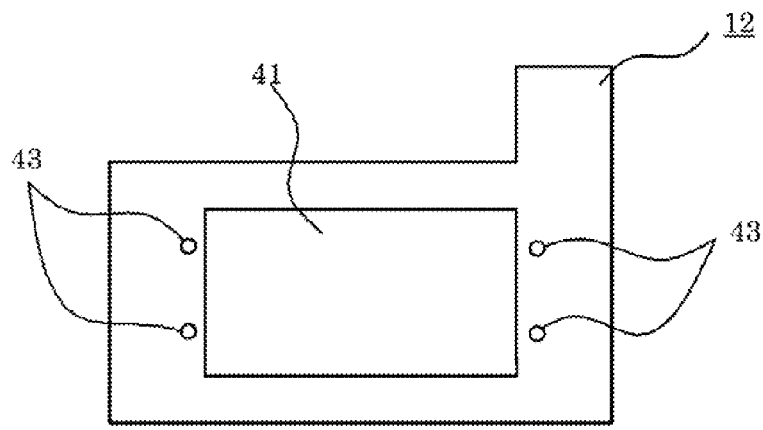
FIG. 11 is a top view showing the metal member in the power semiconductor device according to Embodiment 2 of the present invention.

Moreover, the projection 36 may be hollow and cylindrical in shape to be easily plastically deformed. FIG. 9 and FIG. 10 are enlarged cross sectional views around the projection 36 being hollow and cylindrical in shape before and after the projection 36 is deformed subsequent to the insertion of the metal member 12 into the base plate 22, according to Embodiment 2 of the present invention. When the projection 36 is formed to be hollow and cylindrical in shape, the area integrated with the side wall of the protruding portion 31 in the base plate 22 is reduced, and additionally the cross sectional area of the projection 36 is reduced, so that the projection 36 can be plastically deformed by a smaller load. Note that, when the projection 36 has a shape completely separated from the side wall of the protruding portion 31 in the base plate 22, the notches 43 of the metal member 12 may be holes separated from the cut-out portion 41 as illustrated in FIG. 11.

Embodiment 3

Figure 12:
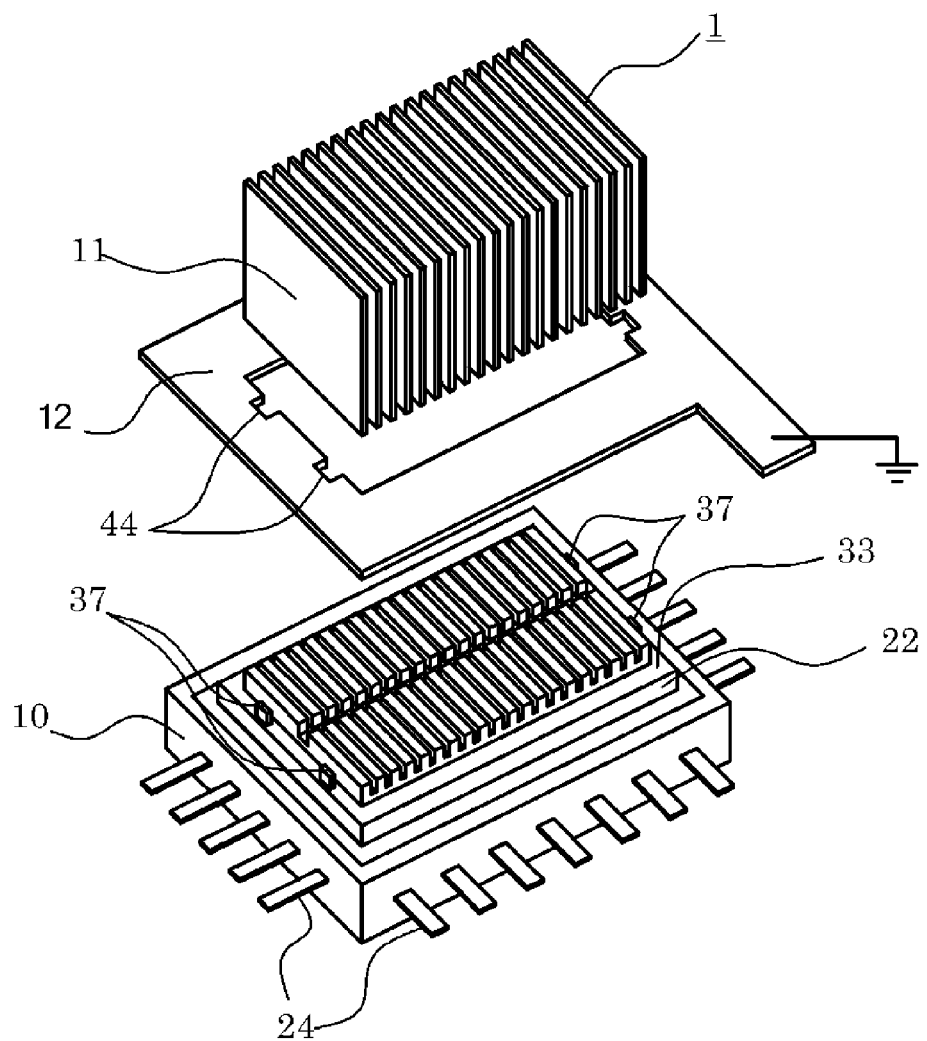
FIG. 12 is an exploded perspective view showing a configuration of a power semiconductor device according to Embodiment 3 of the present invention.
Figure 13:
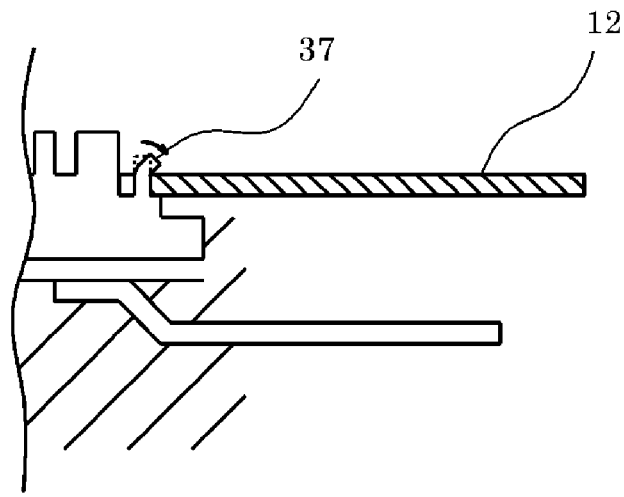
FIG. 13 is an enlarged cross sectional view around a projection after a metal member and a base plate are joined in the power semiconductor device according to Embodiment 3 of the present invention.

FIG. 12 is an exploded perspective view showing a configuration of a power semiconductor device according to Embodiment 3 of the present invention, and FIG. 13 is an enlarged cross sectional view around a projection 37 after a metal member 12 and a base plate 22 are joined according to Embodiment 3 of the present invention. In Embodiment 3, the projection 37 is formed to have a plate-like structure. As illustrated in FIG. 13, the projection 37 is plastically deformed to be pushed down onto the surface of the metal member 12. That is, in the other embodiments, a load is applied to the direction perpendicular to the flat surface 33 of the base plate 22 in order to plastically deform the projection 37; however in the present embodiment, the projection 37 can be plastically deformed by applying a load to a substantially parallel direction of the flat surface 33 of the base plate 22, so that a large load can be suppressed from being applied to the power semiconductor element located under the base plate 22. Furthermore, in the cross section of the projection 37, the length of a side perpendicular to the load application direction is longer than the thickness in the direction to which the projection tilts by the load. Accordingly, a structure can be realized in which the load required to plastically deform the projection 37 can be reduced, and moreover the metal member 12 is fixed sufficiently rigidly to the base plate 22, and thus the electrical resistance between the base plate 22 and the metal member 12 can be sufficiently lowered. By the structure described above, the influence on the power semiconductor element by the load for plastically deforming the projection 37 can be reduced more.

Embodiment 4

Figure 14:
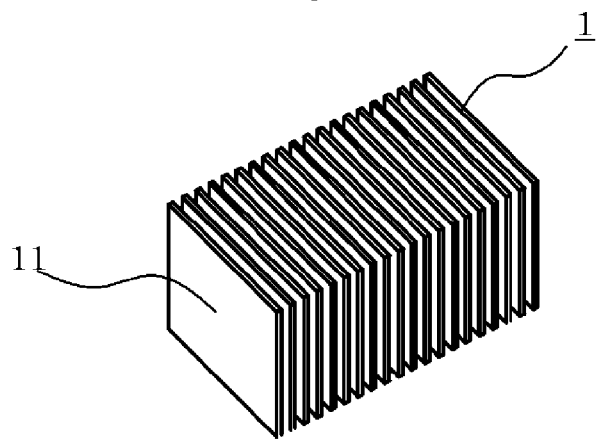
FIG. 14 is an exploded perspective view showing a configuration of a power semiconductor device according to Embodiment 4 of the present invention.
Figure 14:
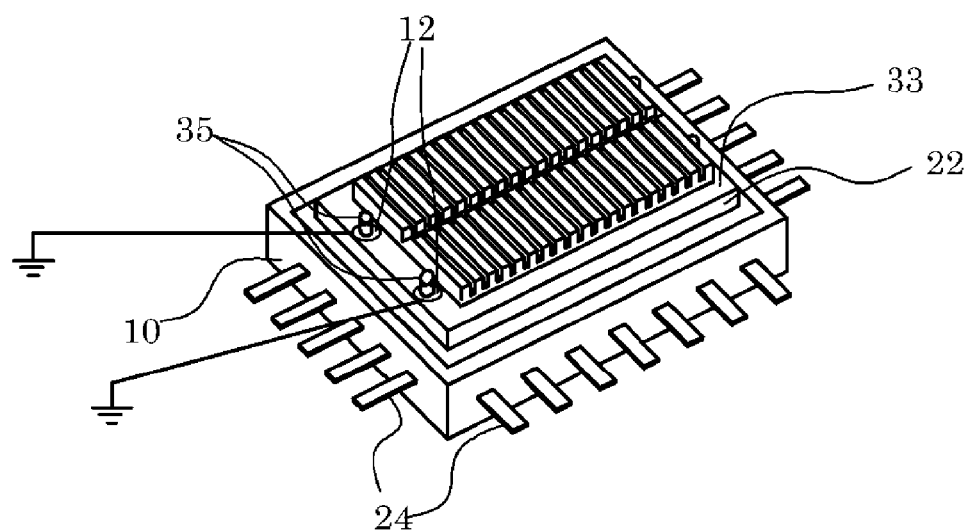
Figure 15:
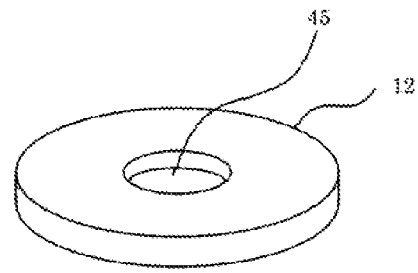
FIG. 15 is a perspective view showing a metal member according to Embodiment 4 of the present invention.

FIG. 14 is an exploded perspective view showing a configuration of a power semiconductor device according to Embodiment 4 of the present invention, and FIG. 15 is a perspective view of a metal member 12. The difference compared to Embodiment 1 is that, in Embodiment 1, the protruding portion 31 and the plurality of projections 35 of the base plate 22 can be inserted into the cut-out portion 41 having substantially rectangular shape in the metal member 12, but in Embodiment 4, a metal member as illustrated in FIG. 15 is circular and in a washer shape having a notch 45 (hole) at the center thereof for fitting only the projection 35, and one projection 35 is fitted in a single metal member 12. In FIG. 14, a configuration where two metal members 12 are fitted to the projections 35 at two positions is illustrated, but the number of positions may be one, three or more and may be chosen so that the electrical conduction can be sufficiently secured. After the washer-shaped metal members 12 are fitted to the projections 35, the base plate and the metal members 12 are fixed together by deforming the projections 35 in the same way as Embodiment 1, and each of the metal members 12 is connected to the earth ground. Thus, similar to Embodiment 1, noise radiated from the power semiconductor element is reduced and malfunction of the power semiconductor element can be suppressed. Note that the metal member 12 is not limited to be washer-shaped, and the shape thereof may be arbitrary as long as the notch 45 (a hole shape is also included) is provided so as to fit to the projection 35 formed in the base plate 22. Moreover, the projection shape may also be the shapes described in the other embodiments.

Embodiment 5

Figure 16:
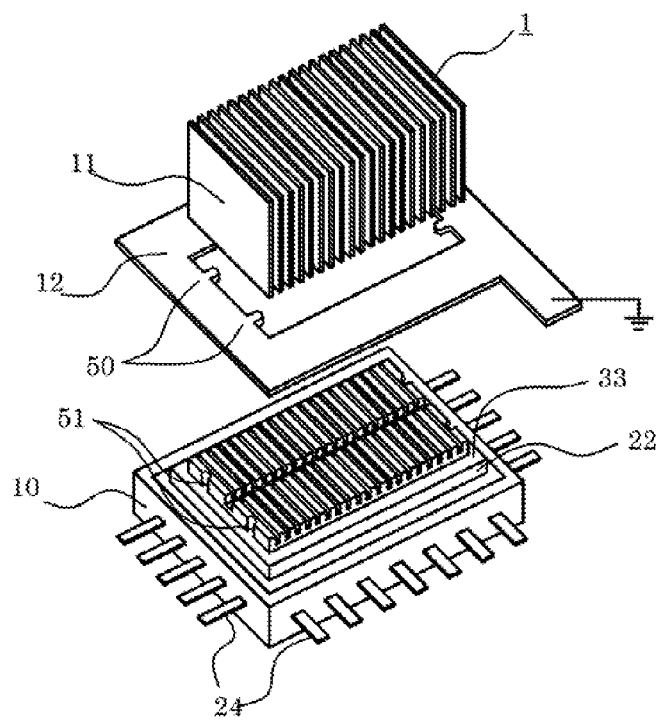
FIG. 16 is an exploded perspective view showing a configuration of a power semiconductor device according to Embodiment 5 of the present invention.

FIG. 16 is an exploded perspective view showing a configuration of a power semiconductor device according to Embodiment 5 of the present invention. The difference compared to Embodiment 1 is that the metal member 12 has a cut-out portion into which the protruding portion 31 is inserted, but has no notches. That is, projections in the base plate 22 are formed to be within the protruding portion 31. As illustrated in FIG. 16, positioning portions 51 are formed in the base plate 22 by machining the protruding portion 31 at the same positions where the projections 35 in Embodiment 1 are provided, and projections 38 (not illustrated) are formed inside the positioning portions 51 in the base plate. Positioning portions 50 in the metal member 12 are provided at the same positions as the notches 42 in Embodiment 1.

Figure 17:
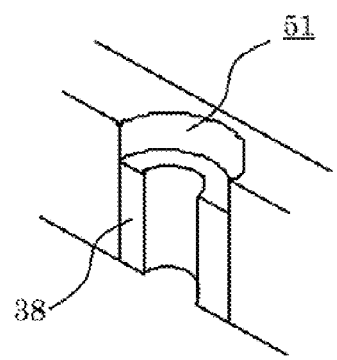
FIG. 17 is an enlarged view of a positioning portion of a base plate in the power semiconductor device according to Embodiment 5 of the present invention.
Figure 18:
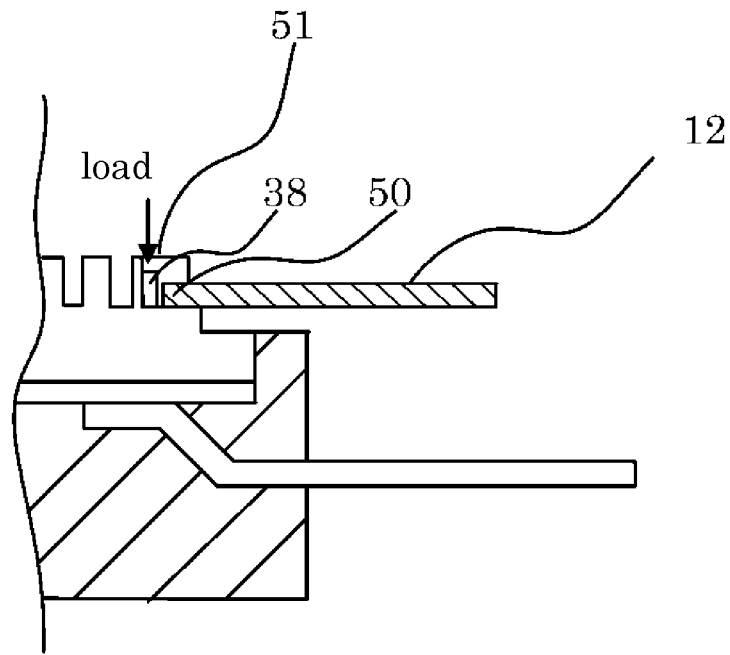
FIG. 18 is an enlarged cross sectional view around a projection after a metal member is inserted into the base plate and before the projection is not deformed yet according to Embodiment 5 of the present invention.
Figure 19:
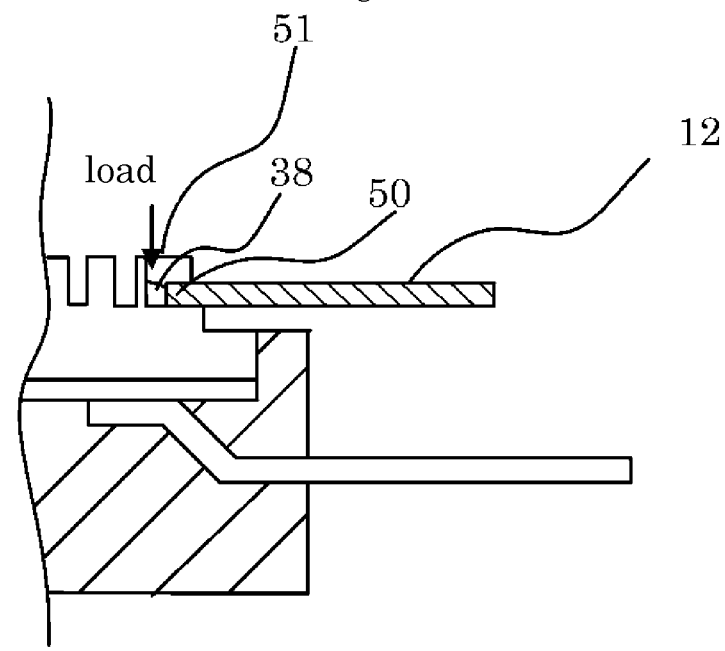
FIG. 19 is an enlarged cross sectional view around the projection after the metal member is inserted into the base plate and the projection is deformed according to Embodiment 5 of the present invention.

FIG. 17 is an enlarged view of the positioning portion 51 in the base plate. The projection 38 is provided inside the positioning portion 51 in the base plate in such a shape that the step height is smaller than the height of the protruding portion 31. FIG. 18 and FIG. 19 are enlarged cross sectional views around the projection before and after the projection is deformed when the metal member is inserted into the base plate, according to the present embodiment. The projection 38 is plastically deformed by applying a load toward the bottom, the plastically deformed projection 38 spreads into the gap between the positioning portion 51 in the base plate and the positioning portion 50 in the metal member, and adheres tightly to the metal member 12, thereby fixing the metal member 12 to the base plate 22. In this case, oxide films are also damaged, and thus the electrical conduction can also be secured. In the present embodiment, similar to Embodiment 1, noise radiated from the power semiconductor element is reduced and malfunction of the power semiconductor element can be suppressed.

EXPLANATION OF REFERENCE CHARACTERS

1: power semiconductor device
11: heat radiation fin
12: metal member (electrically conductive member)
21: power semiconductor element
22: base plate
31: protruding portion
32: groove
35, 36, 37, and 38: projection
41: cut-out portion
42, 43, 44, and 45: notch

The invention claimed is:

1. A power semiconductor device comprising:
a power semiconductor element;
a base plate that includes a projection, is made of electrically conductive material, and is thermally connected to the power semiconductor element so as for heat generated from the power semiconductor element to be conducted to a heat radiation fin; and
an electrically conductive member that is fixed to the base plate, is electrically conducted to the base plate, and is connected to earth ground, wherein
the projection provided in the base plate is fitted into a notch provided in the electrically conductive member, and by deforming the projection, the electrically conductive member is fixed to the base plate and electrical conduction can be secured.

2. A power semiconductor device comprising:
a power semiconductor element;
a base plate that includes a projection, is made of electrically conductive material, and is thermally connected to the power semiconductor element so as for heat generated from the power semiconductor element to be conducted to a heat radiation fin; and
an electrically conductive member that is fixed to the base plate, is electrically conducted to the base plate, and is connected to earth ground, wherein
by deforming the projection provided in the base plate, the projection adheres tightly to a periphery of the electrically conductive member so that the electrically conductive member is fixed to the base plate and electrical conduction can be secured.

3. The power semiconductor device according to claim 1, wherein
the base plate includes a protruding portion supporting a heat radiation fin and a flat surface around the protruding portion;
the electrically conductive member includes a cut-out portion into which the protruding portion is inserted; and
the protruding portion is inserted into the cut-out portion and a rear surface of the electrically conductive member comes into contact with the flat surface, so that the electrically conductive member is positioned with respect to the base plate.

4. The power semiconductor device according to claim 2, wherein
the base plate includes a protruding portion supporting a heat radiation fin and a flat surface around the protruding portion;
the electrically conductive member includes a cut-out portion into which the protruding portion is inserted; and
the protruding portion is inserted into the cut-out portion and a rear surface of the electrically conductive member comes into contact with the flat surface, so that the electrically conductive member is positioned with respect to the base plate.

5. The power semiconductor device according to claim 1, wherein
the projection is deformed by applying a load in a stacking direction of the base plate and the electrically conductive member; and
the projection is cylindrical in shape.

6. The power semiconductor device according to claim 3, wherein
the projection is deformed by applying a load in a stacking direction of the base plate and the electrically conductive member; and
the projection is cylindrical in shape.

7. The power semiconductor device according to claim 1, wherein
the projection has a plate-like structure and is deformed by applying a load so as to be pushed down to the electrically conductive member side; and
in a cross section of the projection, the length of a side perpendicular to the load application direction is longer than a thickness in a direction such that the projection tilts by the load.

8. The power semiconductor device according to claim 3, wherein
the projection has a plate-like structure and is deformed by applying a load so as to be pushed down to the electrically conductive member side; and
in a cross section of the projection, the length of a side perpendicular to the load application direction is longer than a thickness in a direction such that the projection tilts by the load.

9. The power semiconductor device according to claim 1, wherein the projection is hollow.

10. The power semiconductor device according to claim 3, wherein the projection is hollow.

11. The power semiconductor device according to claim 1, wherein only a bottom of the projection is integrated with the base plate.

12. The power semiconductor device according to claim 3, wherein only a bottom of the projection is integrated with the base plate.

* * * * *